(12) United States Patent
Endoh

(10) Patent No.: US 10,278,316 B2
(45) Date of Patent: *Apr. 30, 2019

(54) GROUNDING STRUCTURE FORMED OF RESIN MATERIAL

(71) Applicant: TOYOTA JIDOSHA KABUSHIKI KAISHA, Toyota-shi, Aichi-ken (JP)

(72) Inventor: Sho Endoh, Toyota (JP)

(73) Assignee: TOYOTA JIDOSHA KABUSHIKI KAISHA, Toyota-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/874,522

(22) Filed: Jan. 18, 2018

(65) Prior Publication Data

US 2018/0235114 A1 Aug. 16, 2018

(30) Foreign Application Priority Data

Feb. 10, 2017 (JP) ................. 2017-023340

(51) Int. Cl.
*B60R 16/06* (2006.01)
*B60R 16/02* (2006.01)
*H05K 9/00* (2006.01)
*B60L 11/18* (2006.01)

(52) U.S. Cl.
CPC ........ *H05K 9/0064* (2013.01); *B60L 11/1809* (2013.01); *B60R 16/02* (2013.01); *H05K 9/0003* (2013.01)

(58) Field of Classification Search
CPC .......... B60R 16/06; H01B 5/14; H01B 17/62; H01R 13/6596

USPC .... 439/92; 174/377, 51, 521, 524, 525, 533, 174/556, 565
See application file for complete search history.

(56) References Cited

U.S. PATENT DOCUMENTS

| 6,344,972 | B2 * | 2/2002 | Estieule | H01R 4/64 361/753 |
| 6,477,027 | B1 * | 11/2002 | McKelvy | H05F 3/025 174/544 |
| 6,511,257 | B1 * | 1/2003 | Seaux | E01C 9/086 404/34 |
| 6,846,986 | B1 * | 1/2005 | Ravid | H05K 9/0039 174/51 |
| 7,804,044 | B2 * | 9/2010 | Diemer | H05B 3/146 219/217 |
| 7,934,885 | B2 | 5/2011 | Fournier | |

(Continued)

FOREIGN PATENT DOCUMENTS

JP 2016-107874 A 6/2016

OTHER PUBLICATIONS

USPTO, Non-final Office Action issued to U.S. Appl. No. 15/874,464 dated Aug. 7, 2018. total 23 pages.

*Primary Examiner* — Harshad C Patel
(74) *Attorney, Agent, or Firm* — Hunton Andrews Kurth LLP

(57) ABSTRACT

A grounding structure for a vehicle provided with a floor portion formed of a resin material includes a sheet-shaped wiring sheet including a conductive material for electrical connection between an electric power supply and an electronic component and a sheet-shaped conductive portion electrically connected to a grounding potential. The conductive portion includes a part disposed to overlap a surface of the wiring sheet on an inner portion side of the vehicle.

5 Claims, 5 Drawing Sheets

(56) References Cited

U.S. PATENT DOCUMENTS

| | | | |
|---|---|---|---|
| 8,287,285 B2* | 10/2012 | Mainville | H05K 1/0215 296/1.08 |
| 8,382,393 B1* | 2/2013 | Phillips | E01C 9/086 404/34 |
| 8,902,559 B2 | 12/2014 | Xu | |
| 8,902,599 B2* | 12/2014 | Chao | H05K 5/069 174/142 |
| 9,315,951 B1 | 4/2016 | Penland, Jr. et al. | |
| 9,368,918 B2* | 6/2016 | McDowell | E01C 9/08 |
| 2004/0253861 A1* | 12/2004 | Schubert | H01H 3/141 439/206 |
| 2008/0075533 A1* | 3/2008 | Fournier | E01C 9/08 404/41 |
| 2014/0193196 A1 | 7/2014 | Fournier | |
| 2016/0304037 A1* | 10/2016 | Yagi | B60R 16/02 |

* cited by examiner

GROUNDING STRUCTURE FORMED OF RESIN MATERIAL

INCORPORATION BY REFERENCE

The disclosure of Japanese Patent Application No. 2017-023340 filed on Feb. 10, 2017 including the specification, drawings and abstract is incorporated herein by reference in its entirety.

BACKGROUND

1. Technical Field

The disclosure relates to a vehicular grounding structure.

2. Description of Related Art

Forming the body of a vehicle such as an automobile with a resin such as plastic has been studied. For example, Japanese Unexamined Patent Application Publication No. 2016-107874 (JP 2016-107874 A) discloses a routing structure in which a conductive material as a routing body is disposed in a resin material of a vehicle body formed of the resin material. In the vehicle body that is disclosed in JP 2016-107874 A, the resin material is large, and thus the resin material may be damaged by failing to endure the stress that is attributable to the weight of the resin material itself. Because the conductive material is directly embedded in the body, the embedded conductive material may be damaged and a wiring function may be lost in a case where the vehicle undergoes an impact.

SUMMARY

The present inventors recognized the followings with regard to a vehicular grounding structure. It is conceivable that the entire body or a part of the body is resinified so that the weight of the vehicle is reduced in response to a request for lower fuel consumption. A metallic body absorbs unnecessary electromagnetic waves as a grounding member wrapping a vehicle. When the body is resinified, the influence of the electromagnetic waves increases as the grounding performance relatively declines. It is conceivable that the electromagnetic waves radiated from a wire harness by a signal flowing through a signal line and an electric power supply line are not sufficiently absorbed as the grounding performance declines and the insufficient absorption affects electronic equipment mounted in the vehicle (hereinafter, referred to as in-vehicle equipment) by, for example, causing the in-vehicle equipment to malfunction. The present inventors recognized from the above that the vehicular grounding structure has room for improvement from the viewpoint of suppressing the influence of the electromagnetic waves on the in-vehicle equipment that are radiated from the electric power supply line and the signal line.

The disclosure provides a vehicular grounding structure capable of suppressing an influence of electromagnetic waves radiated from an electric power supply line and a signal line on in-vehicle equipment.

An aspect of the disclosure relates to a grounding structure for a vehicle provided with a floor portion formed of a resin material. The grounding structure includes a sheet-shaped wiring sheet including a conductive material for electrical connection between an electric power supply and an electronic component and a sheet-shaped conductive portion electrically connected to a grounding potential. The conductive portion includes a part disposed to overlap a surface of the wiring sheet on an inner portion side of the vehicle.

According to the aspect of the disclosure, the sheet-shaped conductive portion connected to the grounding potential is capable of overlapping the wiring sheet.

With the disclosure, a vehicular grounding structure can be provided that is capable of suppressing an influence of electromagnetic waves radiated from an electric power supply line and a signal line on in-vehicle equipment.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
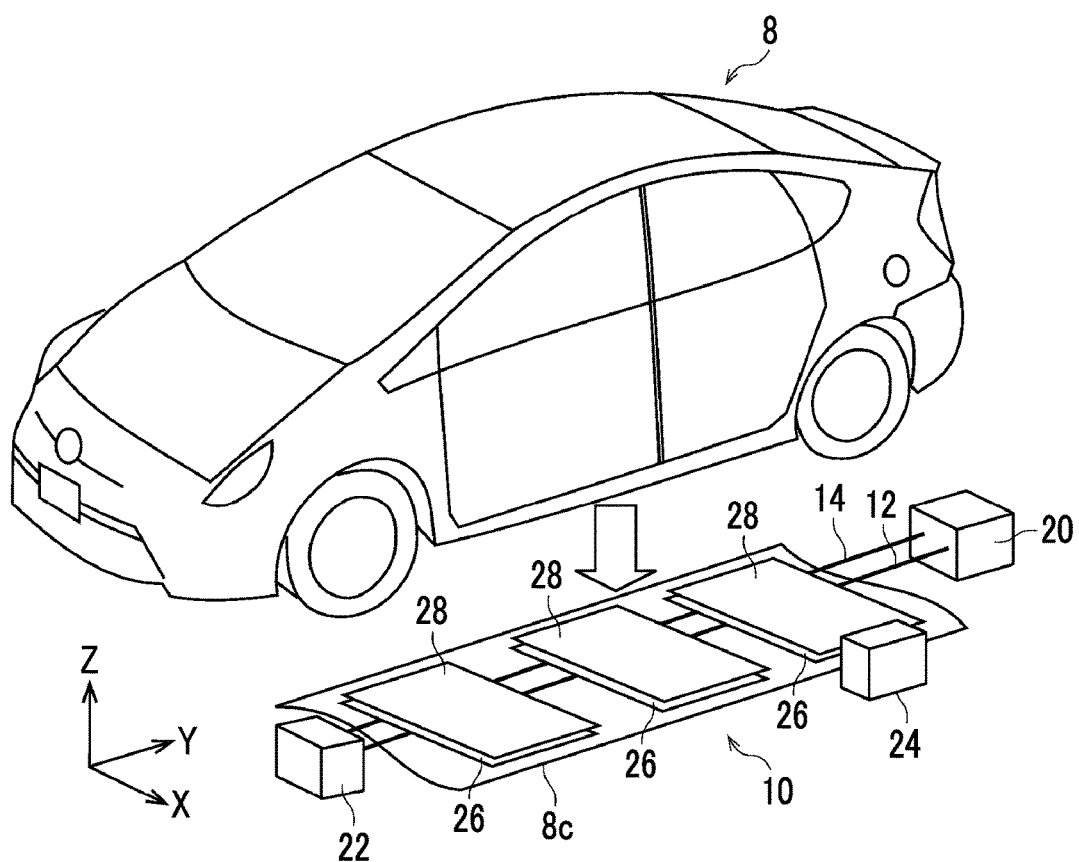
FIG. 1 is a perspective view illustrating a vehicle provided with a grounding structure according to a first embodiment.

The present inventors conducted research on a vehicle wiring structure and recognized the followings. A resin body structure is conceivable along with a reduction in the weight of a body. In the related art, an electrical component uses a body sheet metal as a grounding. However, it is conceivable that a body becomes unlikely to be grounded once the body is resinified. Accordingly, extension of each grounding wire to a vehicle battery as a wire harness (hereinafter, referred to as a W/H) may result in an increase in cost and an increase in weight. It is conceivable that management is difficult from the viewpoint of routing and bonding and noise design becomes difficult when the W/H is used.

The present inventors found that a routing imitating a substrate is used for communication, electric power supply, and grounding distribution such that a signal line and a return path are made as close as possible and an electric power supply and a grounding are distributed with respect to an engine control unit (ECU) mounted in an engine compartment or the like through a W/H of a main trunk line including the electric power supply and the grounding in a vehicle. For example, a configuration is conceivable in which a W/H of an electric power supply and a grounding is mounted as a main trunk line instead of the vehicle W/H according to the related art and the electric power supply and a grounding potential are supplied to a sheet connected to an ECU, a resistor, a voltage booster, or a voltage step-down transformer in a place where electric power is needed. The sheet can also be used as a signal communication line between a plurality of ECUs. Also conceivable is that the sheet is manufactured in advance and assembled to a vehicle. The above-described configuration can also be applied to routing with respect to an ECU mounted in an instrument panel, a cabin, luggage, or the like and another electronic control unit. Each of the embodiments to be described below has been devised based on the idea described above. Details thereof will be described below.

Hereinafter, preferred embodiments of the disclosure will be described with reference to accompanying drawings. In the embodiments and modification examples, the same reference numerals will be used to refer to the same or equivalent components and members and duplicate description will be omitted as appropriate. The dimensions of the members in each of the drawings are shown in an enlarged or reduced manner as appropriate for ease of understanding. In each of the drawings, illustration of some or parts of the members that are not essential in the description of the embodiments is omitted. Although the terms that include ordinal numbers such as first and second are used for describing various components, the sole purpose of the terms is to distinguish one component from another component and the components are not limited by the terms.

First Embodiment

FIG. 1 is a perspective view illustrating a vehicle 8 provided with a grounding structure 10 according to a first embodiment. The following description will be based on an XYZ orthogonal coordinate system. The X-axis direction corresponds to a horizontal right-left direction, the Y-axis direction corresponds to a horizontal front-rear direction, and the Z-axis direction corresponds to a vertical up-down direction. In particular, the X-axis direction corresponds to the width direction of the vehicle 8 and the Y-axis direction corresponds to the front-rear direction of the vehicle 8. In FIG. 1, an example is conceptually illustrated in which the grounding structure 10 is disposed in a floor portion 8c of the vehicle 8. Although vehicles to which the disclosure is applied are not particularly limited, the example that is illustrated in FIG. 1 is provided with tires driven by a power source such as an engine (not illustrated) and a motor (not illustrated). The floor portion 8c is disposed to cover the lower portion of the vehicle 8. The floor portion 8c is formed of various known non-metal materials such as a resin. The material that forms the floor portion 8c may be conductive or non-conductive.

Grounding Structure

The grounding structure 10 according to the embodiment is a grounding structure for the vehicle 8 that is provided with the floor portion 8c which is formed of a resin material. The grounding structure 10 is a routing system disposed to suppress an influence of electromagnetic waves radiated from an electric power supply line 12 and a signal line on in-vehicle equipment. As illustrated in FIG. 1, the vehicle 8 is provided with a battery 20, the electric power supply line 12, a grounding line 14, a step-up and step-down transformer 22, an electronic control unit 24, a wiring sheet 26, and a grounding member 28. The grounding member 28 includes a sheet-shaped conductive portion 28b electrically connected to a grounding potential. The wiring sheet 26 and the conductive portion 28b constitute the grounding structure 10. The wiring sheet 26 and the grounding member 28 can be disposed in any place of the vehicle 8. FIG. 1 shows an example in which the wiring sheet 26 and the grounding member 28 are disposed on the floor surface of the floor portion 8c. The conductive portion 28b of the grounding member 28 is disposed to overlap the vehicle-inner-side surface of the wiring sheet 26. In the example illustrated in FIG. 1, the conductive portion 28b is stacked to overlap the upper side of the wiring sheet 26.

Figure 2:
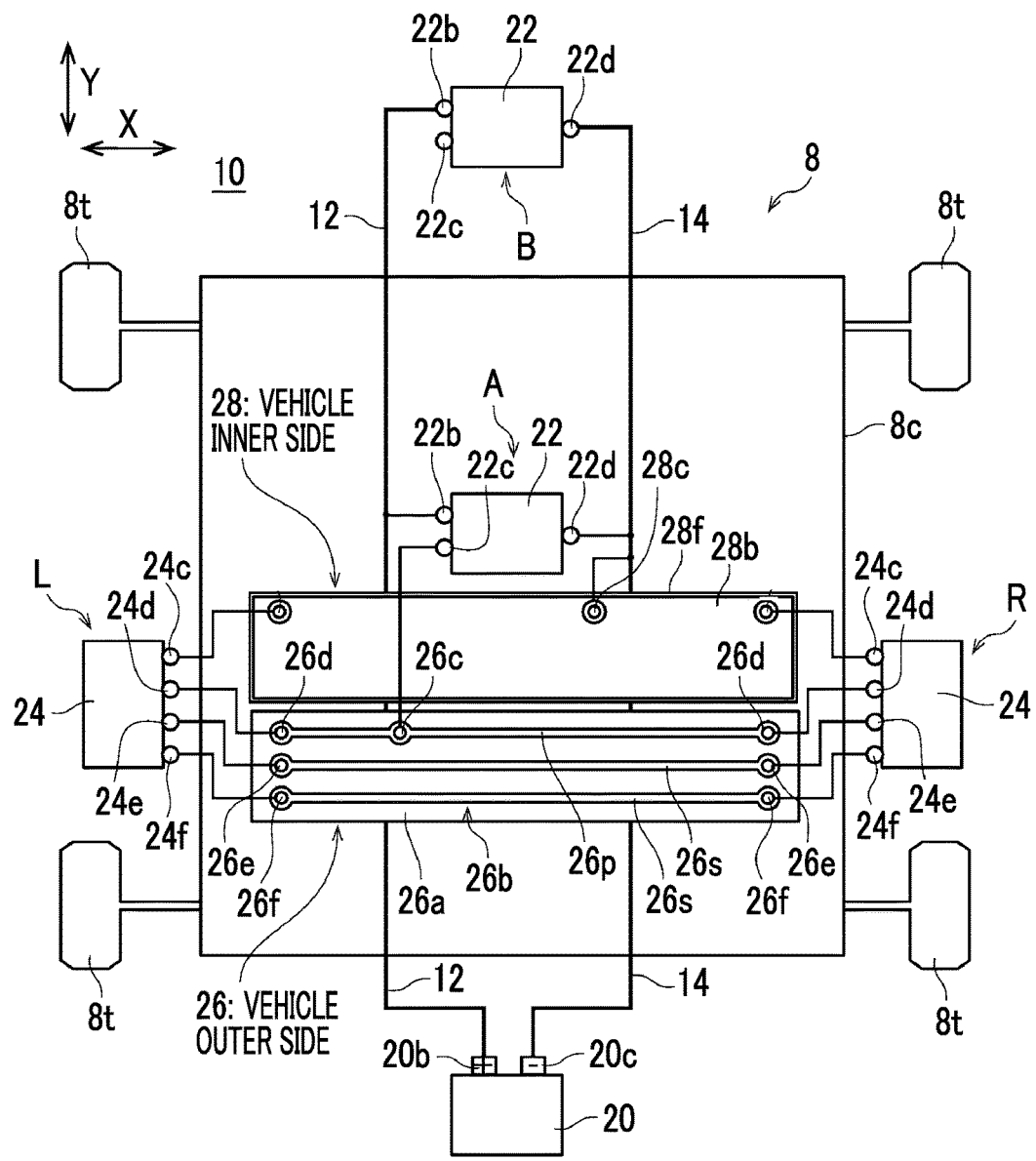
FIG. 2 is a schematic plan view showing the grounding structure illustrated in FIG. 1.
Figure 3:
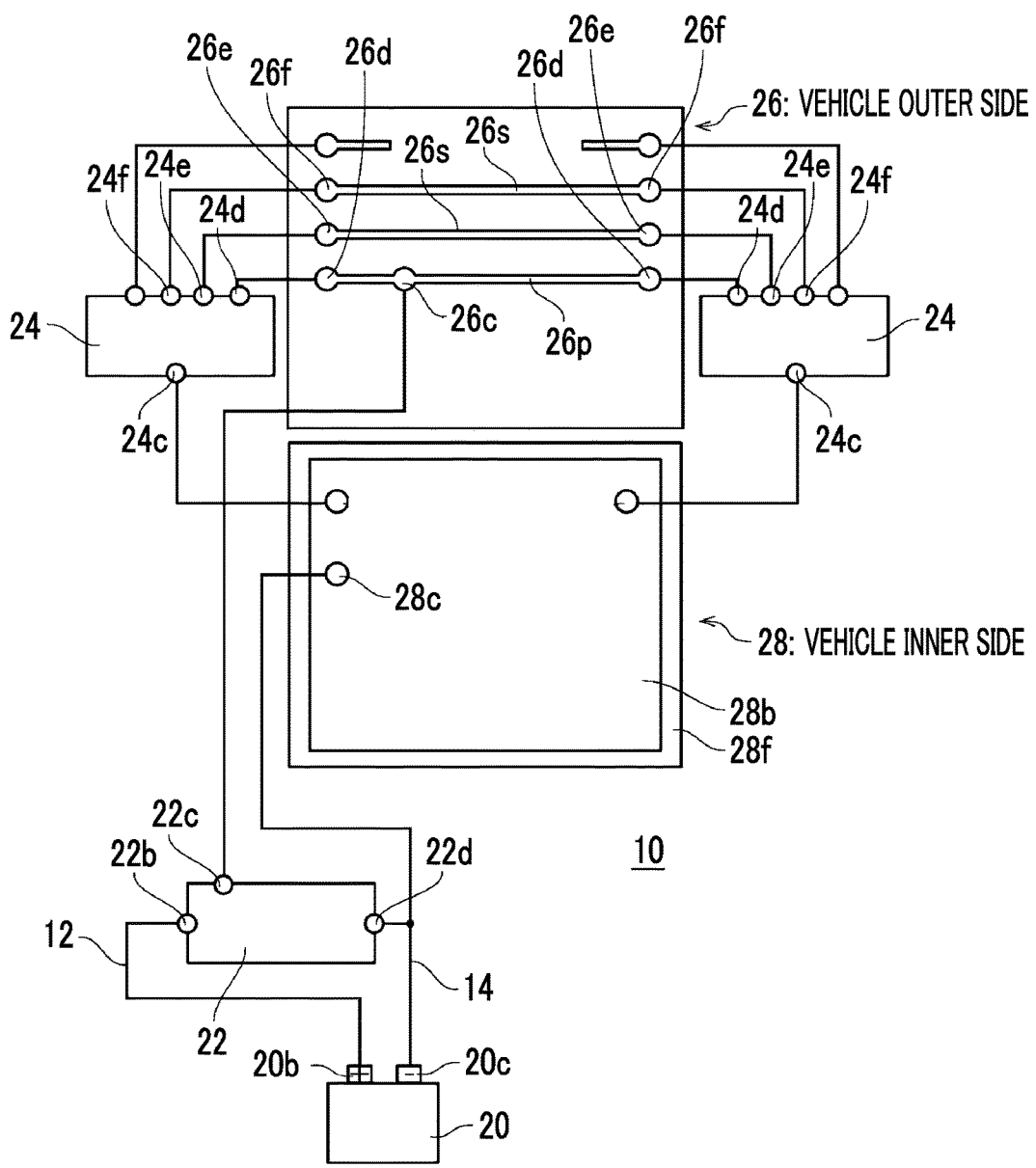
FIG. 3 is an explanatory diagram showing a wiring sheet and a grounding member illustrated in FIG. 1.

FIG. 2 is a schematic plan view showing the grounding structure 10. In FIG. 2, the disposition of tires 8t is conceptually illustrated for easy understanding of relative disposition. FIG. 3 is an explanatory diagram showing the wiring sheet 26 and the grounding member 28. In FIGS. 2 and 3, the grounding member 28 and the wiring sheet 26 are shown side by side for ease of understanding. As illustrated in FIG. 2, the electric power supply line 12 is a trunk line connected to a positive electrode side terminal 20b of the battery 20 and supplying an electric power supply voltage to each place. The grounding line 14 is a trunk line connected to a negative electrode side terminal 20c of the battery 20 and supplying a grounding potential to each place. The grounding potential is referred to as a ground potential in some cases. The battery 20 is electric power supply means for supplying electric power to in-vehicle equipment and may include a battery cell based on various known principles. For example, the battery 20 outputs a voltage of approximately 12 V between the positive electrode side terminal 20b and the negative electrode side terminal 20c. The battery 20 is disposed on, for example, the rear portion side of the vehicle 8.

Step-Up and Step-Down Transformer

The step-up and step-down transformer 22 is an element that outputs an appropriate voltage from a terminal 22c to each electronic control unit 24 by stepping up or stepping down the voltage that is supplied from the electric power supply line 12 to a terminal 22b. For example, the step-up and step-down transformer 22 is a circuit device. One step-up and step-down transformer 22 or a plurality of step-up and step-down transformers 22 is mounted in one vehicle. Two step-up and step-down transformers 22 are illustrated in FIG. 2, one being indicated by A and the other being indicated by B. A terminal 22d of each step-up and step-down transformer 22 is connected to the grounding line 14. Various known step-up and step-down means such as a resistive voltage divider and a series regulator are capable of constituting the step-up and step-down transformer 22. The step-up and step-down transformer 22 according to the first embodiment includes a switching regulator and is characterized by high conversion efficiency.

Electronic Control Unit

The electronic control unit 24 is a circuit element for controlling electrical in-vehicle devices such as an engine control device and an operation control device of the vehicle 8. For example, the electronic control unit 24 has a built-in microcontroller. One electronic control unit 24 or a plurality of electronic control units 24 is mounted in one vehicle. The electronic control unit 24 is disposed in the vicinity of a control object of the electronic control unit 24. Two electronic control units 24 are illustrated in FIG. 2, one being indicated by L and the other being indicated by R. A terminal 24d of the electronic control unit 24 is electrically connected to the terminal 22c of the step-up and step-down transformer 22 via a wiring pattern 26b of the wiring sheet 26. The voltage that is output from the terminal 22c of the step-up and step-down transformer 22 is supplied to the terminal 24d of the electronic control unit 24. A terminal 24c of the electronic control unit 24 is electrically connected to the grounding line 14 via the conductive portion 28b of the grounding member 28. In other words, the voltage is supplied to the electronic control unit 24 via the wiring sheet 26 and the grounding member 28.

Wiring Sheet

The wiring sheet 26 is a sheet-shaped wiring material that has a wiring pattern which is a conductive material for electrical connection between an electric power supply and an electronic component and between electronic components. For example, the wiring sheet 26 is a wiring substrate. In particular, the wiring sheet 26 receives the electric power supply that is output from the step-up and step-down transformer 22, distributes the electric power supply to each electronic control unit 24 including an electronic component, and distributes a signal from the electronic control unit 24 to another electronic control unit 24. One wiring sheet 26 or a plurality of wiring sheets 26 is mounted in one vehicle. One wiring sheet 26 is illustrated in FIG. 2. The wiring pattern 26b is formed of a conductive material such as copper and aluminum. The wiring pattern 26b is fixed by an adhesive or the like on, for example, an insulating sheet 26a. The wiring pattern 26b can be formed by a known pattern formation method such as etching and plating.

The insulating sheet 26a may be a rigid plate-shaped sheet using a fluororesin such as a phenol resin, an epoxy resin, and Teflon (registered trademark), a glass fiber, alumina, tungsten, or the like. The insulating sheet 26a may also be a flexible sheet using a polyimide film, a polyester film, or the like. The insulating sheet 26a may include various reinforcing materials such as a reinforcing fiber. For example, the flexible sheet can be adopted in a case where detailed work is needed and a variable structure is configured and the rigid plate-shaped sheet can be adopted in a case where a sheet with a relatively large area is needed. The insulating sheet 26a may also include both the rigid plate-shaped sheet and the flexible sheet.

The wiring pattern 26b includes an electric power supply pattern 26p and a signal pattern 26s. The electric power supply pattern 26p is a pattern for supplying the electric power reception terminal 24d of the electronic control unit 24 with the voltage that is output from the terminal 22c of the step-up and step-down transformer 22. The electric power supply pattern 26p has a terminal 26c electrically connected to the terminal 22c of the step-up and step-down transformer 22 and a terminal 26d electrically connected to the terminal 24d of the electronic control unit 24. The signal pattern 26s is a pattern for transmitting a signal between signal input and output terminals 24e, 24f of the electronic control units 24. The signal pattern 26s has a terminal 26e and a terminal 26f electrically connected to the terminals 24e, 24f of the electronic control units 24.

The wiring sheet 26 may be formed in any shape. The wiring sheet 26 according to the first embodiment is formed in an oblong and substantially rectangular shape in which the dimension of the wiring sheet 26 along the width direction of the vehicle 8 is longer than the dimension of the wiring sheet 26 along the front-rear direction of the vehicle 8. The wiring to the electronic control unit 24 that is disposed in a side portion of the vehicle 8 can be shortened. The wiring sheet 26 is attached to the floor portion 8c by a fastener (not illustrated). The wiring sheet 26 may be fixed directly or indirectly to the floor portion 8c. For example, the wiring sheet 26 may be fixed to the floor portion 8c by known fixing means such as screw fastening, adhesion, and welding.

Grounding Member

The grounding member 28 is a sheet material including the sheet-shaped conductive portion 28b electrically connected to the grounding potential. The conductive portion 28b includes a part disposed to overlap the surface of the wiring sheet 26 that is on the inner portion side of the vehicle 8. Although a gap may be present between the conductive portion 28b and the wiring sheet 26, it is desirable that the gap is as small as possible. The conductive portion 28b is electrically connected to the grounding line 14 and is kept at the grounding potential as a whole. The conductive portion 28b is disposed to cover the wiring sheet 26 by corresponding to the wiring sheet 26. The conductive portion 28b can be formed of a known conductive material. For example, the conductive portion 28b may be formed as a metal plate, a metal foil, or a metal film that is formed of a metal material such as copper. In general, the conductive portion 28b may also be formed of a non-metal material such as a conductive carbon fiber. The conductive portion 28b may also be formed of aluminum or a material smaller in specific gravity than aluminum. Examples of the material include a carbon fiber and a magnesium alloy.

The grounding member 28 may also include a resinous sheet 28f stacked on the conductive portion 28b. In other words, the conductive portion 28b is stacked on the resinous sheet 28f. The resinous sheet 28f can be formed of a known resin material. Handling of the grounding member 28 is facilitated by the resinous sheet 28f being stacked on the conductive portion 28b. The resinous sheet 28f is optional. The conductive portion 28b may be formed in any shape. The conductive portion 28b according to the first embodiment is formed in an oblong and substantially rectangular shape in which the dimension of the conductive portion 28b along the width direction of the vehicle is longer than the dimension of the conductive portion 28b along the front-rear direction of the vehicle. In other words, the conductive portion 28b has a longitudinal direction that is along the width direction of the vehicle 8.

The conductive portion 28b is electrically connected to the grounding line 14 and is kept at the grounding potential as a whole. The grounding line 14 is connected to a terminal 28c disposed in the conductive portion 28b by known connection means such as brazing, pressure welding, welding, adhesion, and screw fastening. The conductive portion 28b may be directly or indirectly fixed to a part of a vehicle body such as the floor portion 8c in a state where the conductive portion 28b is stacked on the wiring sheet 26. For example, the fixing may be performed by known fixing means such as screw fastening, adhesion, and welding.

The action and effect of the grounding structure 10 according to the first embodiment configured as described above will be described below. It is desirable that the influence of the electromagnetic waves radiated from the wiring of the signal, the electric power supply, and the like is small. In this regard, the grounding structure 10 according to the first embodiment, which is a grounding structure for the vehicle 8 provided with the floor portion 8c formed of a resin material, is provided with the sheet-shaped wiring sheet 26 that has the wiring pattern 26b which is a conductive material for electrical connection between an electric power supply and an electronic component and the sheet-shaped conductive portion 28b that is electrically connected to a grounding potential and the conductive portion 28b includes the part disposed to overlap the surface of the wiring sheet 26 that is on the inner portion side of the vehicle. With the configuration described above, the electromagnetic waves or the like radiated from the wiring pattern 26b can be absorbed in the conductive portion 28b connected to the grounding potential, and thus an adverse effect on in-vehicle equipment such as the electronic control unit 24 in the vehicle can be suppressed. The vehicle wire harness of the electric power supply, grounding, and signal can be further reduced by the use of the wiring sheet 26, and thus space saving is facilitated.

With the configuration described above, the durability of the body can be improved as drilling work for grounding the body can be reduced. A grounding point is disposed as a land in the conductive portion 28b, and thus more grounding points can be disposed than in a case where a grounding point is disposed in the body. As more grounding points can be disposed with ease, the places where the groundings are fastened together decrease, which is advantageous in terms of EMC performance and floating grounding. With regard to the electric power supply, grounding, and signal, capacitance increases and a potential difference in a high frequency component decreases by the gap between the wiring pattern 26b and the conductive portion 28b being made as small as possible. As a result, a strip line structure is configured between the wiring pattern 26b and the conductive portion 28b and outward noise radiation is unlikely to occur.

It is desirable that the wiring distance to a grounding point is short. In this regard, in the grounding structure 10 according to the first embodiment, the conductive portion 28b has the longitudinal direction that is along the width direction of the vehicle 8. With the configuration described above, a grounding point is disposed in a longitudinal-direction side end portion of the conductive portion 28b, and thus the wiring distance to the electronic control unit 24 disposed in the side portion of the vehicle 8 can be shortened.

It is desirable that the conductive portion 28b is light in weight for vehicle weight reduction. In this regard, in the grounding structure 10 according to the first embodiment, the conductive portion 28b is formed of aluminum or a material smaller in specific gravity than aluminum. With the configuration described above, vehicle weight reduction is achieved with greater ease than in a case where the conductive portion 28b is formed of a material with a relatively large specific gravity such as copper.

In a case where an impact is received, a short circuit may occur by the conductive portion 28b coming into contact with the wiring pattern 26b or the like and the step-up and step-down transformer 22 may not work properly. In this regard, in the grounding structure 10 according to the first embodiment, the conductive portion 28b is stacked on the resinous sheet 28f. With the configuration described above, the possibility of a short circuit attributable to the conductive portion 28b can be further reduced.

Second Embodiment

Figure 4:
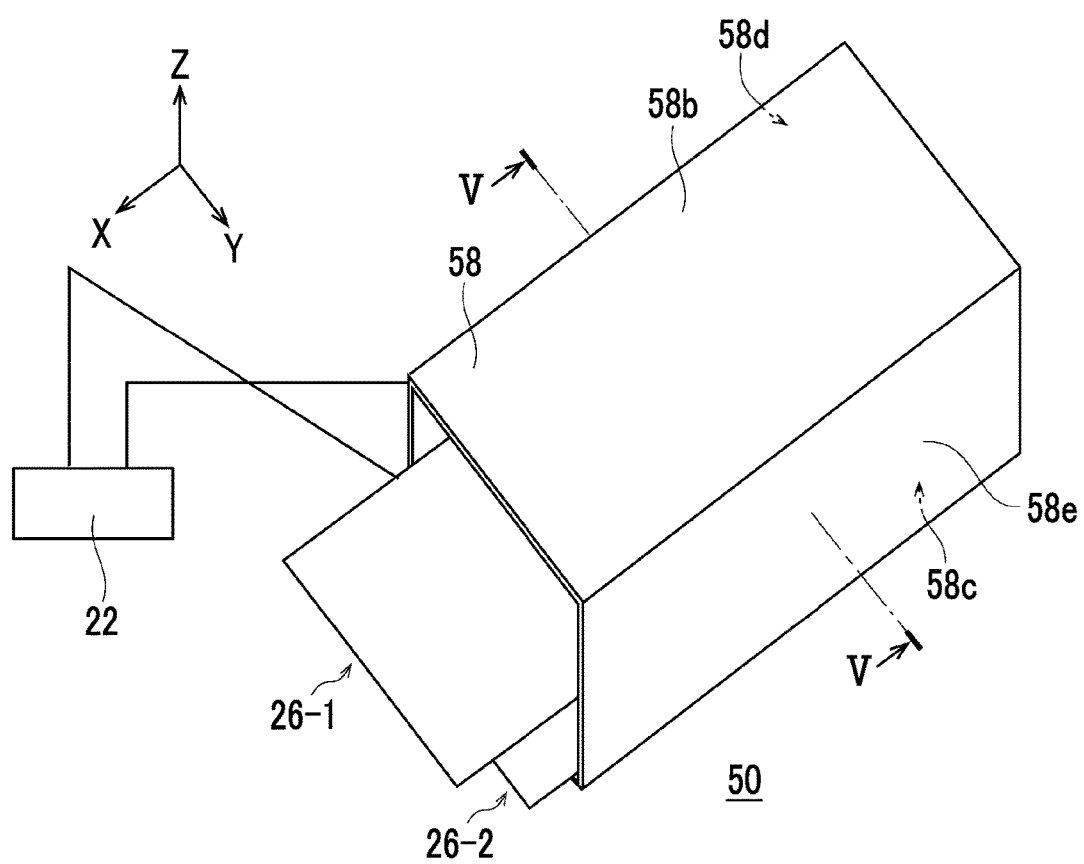
FIG. 4 is a perspective view illustrating a grounding structure according to a second embodiment.
Figure 5:
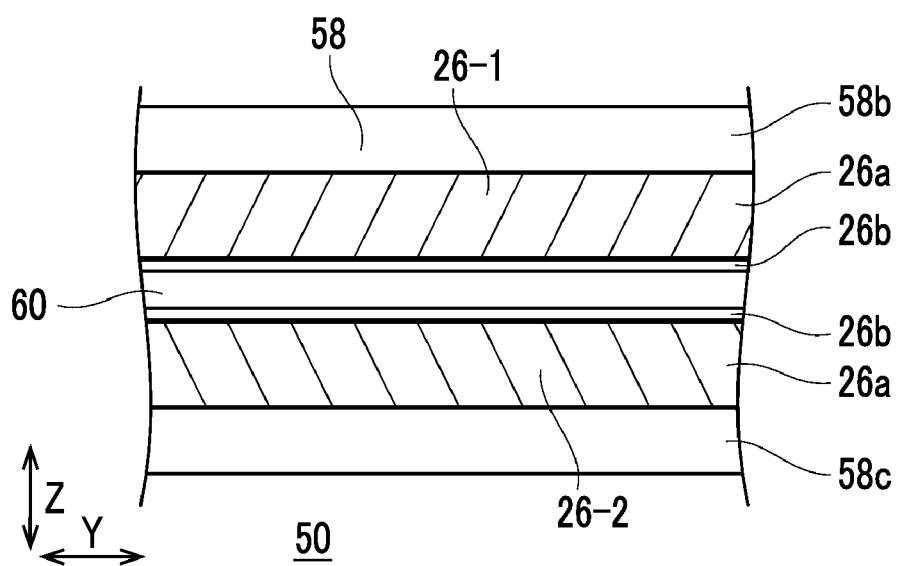
FIG. 5 is a cross-sectional view of the grounding structure taken along line V-V of FIG. 4.

A vehicular grounding structure 50 according to a second embodiment of the disclosure will be described below. FIG. 4 is a perspective view illustrating the grounding structure 50 according to the second embodiment. FIG. 5 is a cross-sectional view taken along line V-V of FIG. 4. The grounding structure 50 according to the second embodiment differs from the grounding structure 10 according to the first embodiment in that the grounding structure 50 according to the second embodiment is provided with a conductive portion 58 instead of the conductive portion 28b of the grounding structure 10 according to the first embodiment and a plurality of (such as two) wiring sheets 26 is disposed in an overlapping manner in the grounding structure 50 according to the second embodiment. The grounding structure 50 according to the second embodiment and the grounding structure 10 according to the first embodiment are similar to each other when it comes to the rest of the configurations. Accordingly, the differences will be described below and duplicate description will be omitted.

In the grounding structure 50, two wiring sheets 26-1, 26-2 are stacked between a first part 58b and a second part 58c as illustrated in FIG. 5. The conductive portion 58 of the grounding structure 50 includes the first part 58b disposed to overlap the surfaces of the wiring sheets 26-1, 26-2 that are on the inner portion side of the vehicle 8 and the second part 58c disposed to overlap the surfaces of the wiring sheets 26-1, 26-2 that are on the outer portion side of the vehicle 8. The wiring pattern 26b of the wiring sheet 26-1 and the wiring pattern 26b of the wiring sheet 26-2 are disposed to face each other. A space 60 is disposed between the wiring sheet 26-1 and the wiring sheet 26-2 in the grounding structure 50 although an insulator may be interposed between the wiring sheet 26-1 and the wiring sheet 26-2. The insulating sheet 26a of the wiring sheet 26-1 faces the first part 58b, and the insulating sheet 26a of the wiring sheet 26-2 faces the second part 58c. The first part 58b and the second part 58c may not be in contact with the insulating sheet 26a. In the grounding structure 50, however, the first part 58b, the second part 58c, and the insulating sheet 26a are disposed such that the first part 58b and the second part 58c are in contact with the insulating sheet 26a. An adhesive may be applied between the conductive portion 58 and the insulating sheet 26a.

The conductive portion 58 further includes a third part 58d and a fourth part 58e surrounding the wiring sheets 26-1, 26-2 in the front-rear direction. The third part 58d extends upward and downward between the respective front ends of the first part 58b and the second part 58c. The fourth part 58e extends upward and downward between the respective rear ends of the first part 58b and the second part 58c. The first part 58b, the second part 58c, the third part 58d, and the fourth part 58e are mutually connected to surround the perimeters of the wiring sheets 26-1, 26-2 and are disposed in a square tubular shape extending in the vehicle width direction. Although the first part 58b, the second part 58c, the third part 58d, and the fourth part 58e may have different vehicle-width-direction dimensions, the first part 58b, the second part 58c, the third part 58d, and the fourth part 58e have the same vehicle-width-direction dimension in the conductive portion 58 according to the second embodiment. The third part 58d and the fourth part 58e may be disposed as members separate from the first part 58b and the second part 58c. The conductive portion 58 can be formed of the same metal material or non-metal material as those mentioned in the description of the conductive portion 28b.

The action and effect of the grounding structure 50 according to the second embodiment formed as described above are similar to those of the grounding structure 10 according to the first embodiment. In addition, with the grounding structure 50 according to the second embodiment, the influence of the electromagnetic waves radiated from the wiring pattern 26b on the inside and outside of the vehicle 8 can be further reduced because the conductive portion 58 is disposed on the vehicle inner and outer sides of the wiring sheets 26-1, 26-2 alike. For example, adverse effects on in-vehicle equipment inside the vehicle and an antenna and an external environment outside the vehicle can be suppressed.

The first and second embodiments have been described above. It is to be understood by those skilled in the art that the embodiments are examples, the embodiments can be modified and changed in various ways within the scope of claims of the disclosure, and modification examples and changes based on the modifications and changes are also within the scope of claims of the disclosure. Accordingly, the above description and drawings in the specification are to be regarded as examples in a non-limitative way.

Modification examples will be described below. In the drawings and description of the modification examples, the same reference numerals will be used to refer to the same or equivalent components and members as in the embodiments and duplicate description common to the embodiments and the modification examples will be omitted as appropriate. The following description will focus on differences between the configurations of the embodiments and the modification examples.

First Modification Example

In the first and second embodiments, an example has been described in which the wiring pattern 26b is stacked on one surface of the insulating sheet 26a. However, the disclosure is not limited thereto. The wiring pattern may also be stacked on both surfaces of the insulating sheet or the wiring pattern and the insulating sheet may be stacked in multiple layers as well. When the configuration described above is adopted, the same action and effect as those of the grounding structures 10, 50 described above can be achieved and the electric power supply, signal, and grounding can be supplied from the wiring pattern of each layer at the same time, and thus a more advanced routing structure can be provided.

Second Modification Example

In the first and second embodiments, an example has been described in which each of the wiring sheet 26 and the grounding member 28 or the conductive portion 58 is attached to the vehicle body. However, the disclosure is not limited thereto. The wiring sheet and the grounding member may also be attached to the vehicle body after being integrated in advance. For example, an integrated unit may be formed by the grounding member being fixed to the wiring sheet and the integrated unit may be fixed to the vehicle body in a vehicle body manufacturing process. When the configuration described above is adopted, the same action and effect as those of the grounding structures 10, 50 described above can be achieved and the labor for attaching the grounding structure to the vehicle body can be reduced at the same time, and thus the assemblability of the vehicle can be improved.

Third Modification Example

In the first and second embodiments, an example has been described in which the wiring sheet 26 and the grounding member 28 or the conductive portion 58 are disposed on the floor surface of the floor portion 8c. However, the disclosure is not limited thereto. The wiring sheet 26 and the grounding member 28 or the conductive portion 58 may be disposed in any place of the vehicle such as a roof surface. When the configuration described above is adopted, the same action and effect as those of the grounding structures 10, 50 described above can be achieved and more diverse grounding structures can be provided at the same time.

Fourth Modification Example

In the first and second embodiments, an example has been described in which the electric power supply line 12 and the grounding line 14 that are trunk lines are supplied from the battery 20. However, the disclosure is not limited thereto. The electric power supply line and the grounding line may also be supplied from an electric power supply device based on another principle such as a fuel cell or a device in which a plurality of types of electric power supply devices is combined. When the configuration described above is adopted, the same action and effect as those of the grounding structures 10, 50 described above can be achieved and more diverse grounding structures can be provided at the same time.

In the drawings used for the description, the sections of some members are hatched to clarify relationships between members. However, the hatching does not limit the materials and textures of the members.

What is claimed is:

1. A grounding structure for a vehicle provided with a floor portion formed of a resin material, the grounding structure comprising:
   a sheet-shaped wiring sheet including a conductive material for electrical connection between an electric power supply and an electronic component; and
   a sheet-shaped conductive portion electrically connected to a grounding potential,
   wherein the conductive portion includes a part disposed to overlap a surface of the wiring sheet toward an inner side of the vehicle,
   wherein the conductive portion has a longitudinal direction such that a dimension along a width direction of the vehicle is longer than a dimension along a front-rear direction of the vehicle.

2. The grounding structure according to claim 1, wherein the conductive portion is provided with a grounding point in a side end portion of the longitudinal direction.

3. The grounding structure according to claim 1, wherein the conductive portion is formed of aluminum or a material smaller in specific gravity than aluminum.

4. The grounding structure according to claim 1, wherein the conductive portion is stacked on a resinous sheet.

5. The grounding structure according to claim 1, wherein the conductive portion includes a part disposed to overlap a surface of the wiring sheet toward an outer side of the vehicle.

* * * * *